(12) United States Patent
Shinotou et al.

(10) Patent No.: US 10,283,435 B2
(45) Date of Patent: May 7, 2019

(54) HEAT DISSIPATION COMPONENT AND TERMINAL DEVICE INCLUDING HEAT DISSIPATION COMPONENT

(71) Applicant: Fujitsu Client Computing Limited, Kanagawa (JP)

(72) Inventors: Kouichi Shinotou, Yokohama (JP); Tadanori Tachikawa, Hachioji (JP); Masashi Yamashita, Kawasaki (JP)

(73) Assignee: Fujitsu Client Computing Limited, Kanagawa (JP)

( * ) Notice: Subject to any disclaimer, the term of this patent is extended or adjusted under 35 U.S.C. 154(b) by 0 days.

(21) Appl. No.: 15/701,735

(22) Filed: Sep. 12, 2017

(65) Prior Publication Data

US 2018/0090416 A1 Mar. 29, 2018

(30) Foreign Application Priority Data

Sep. 29, 2016 (JP) .................................. 2016-191208

(51) Int. Cl.
*H01L 23/40* (2006.01)
*H01L 23/427* (2006.01)

(52) U.S. Cl.
CPC ........ *H01L 23/427* (2013.01); *H01L 23/4006* (2013.01); *H01L 2023/405* (2013.01); *H01L 2023/4031* (2013.01); *H01L 2023/4056* (2013.01); *H01L 2023/4062* (2013.01); *H01L 2023/4068* (2013.01); *H01L 2023/4087* (2013.01)

(58) Field of Classification Search
CPC ......... H01L 23/4006; H01L 2023/4031; H01L 2023/405; H01L 2023/4056; H01L 2023/4062; H01L 2023/4068; H01L 2023/4087; H05K 1/0203; H05K 1/0204
USPC ........................................ 257/713, 718–720
See application file for complete search history.

(56) References Cited

U.S. PATENT DOCUMENTS

| | | | |
|---|---|---|---|
| 8,064,201 B2 * | 11/2011 | Kuo ......................... | G06F 1/20 165/104.33 |
| 2010/0020501 A1 * | 1/2010 | Li ....................... | H01L 23/4006 361/710 |
| 2013/0148299 A1 * | 6/2013 | Honda ................ | H01L 23/4006 361/700 |

FOREIGN PATENT DOCUMENTS

JP 2006-147618 A 6/2006

* cited by examiner

*Primary Examiner* — Matthew E Warren
(74) *Attorney, Agent, or Firm* — Osha Liang LLP

(57) ABSTRACT

A heat dissipation component includes a plate that presses a heat receiving portion against a heat generating portion, and a heat pipe installed at a first surface side of the plate to be in contact with the heat receiving portion, wherein the plate has a shape of an equilateral triangle in plan view from a normal direction of the first surface of the plate, an outer circumferential portion of the plate, except for a portion between each two vertexes of the equilateral triangle, is bent to the first surface side of the plate, and the heat pipe extends to an outside of the plate through a non-bent portion in the outer circumferential portion of the plate.

5 Claims, 12 Drawing Sheets

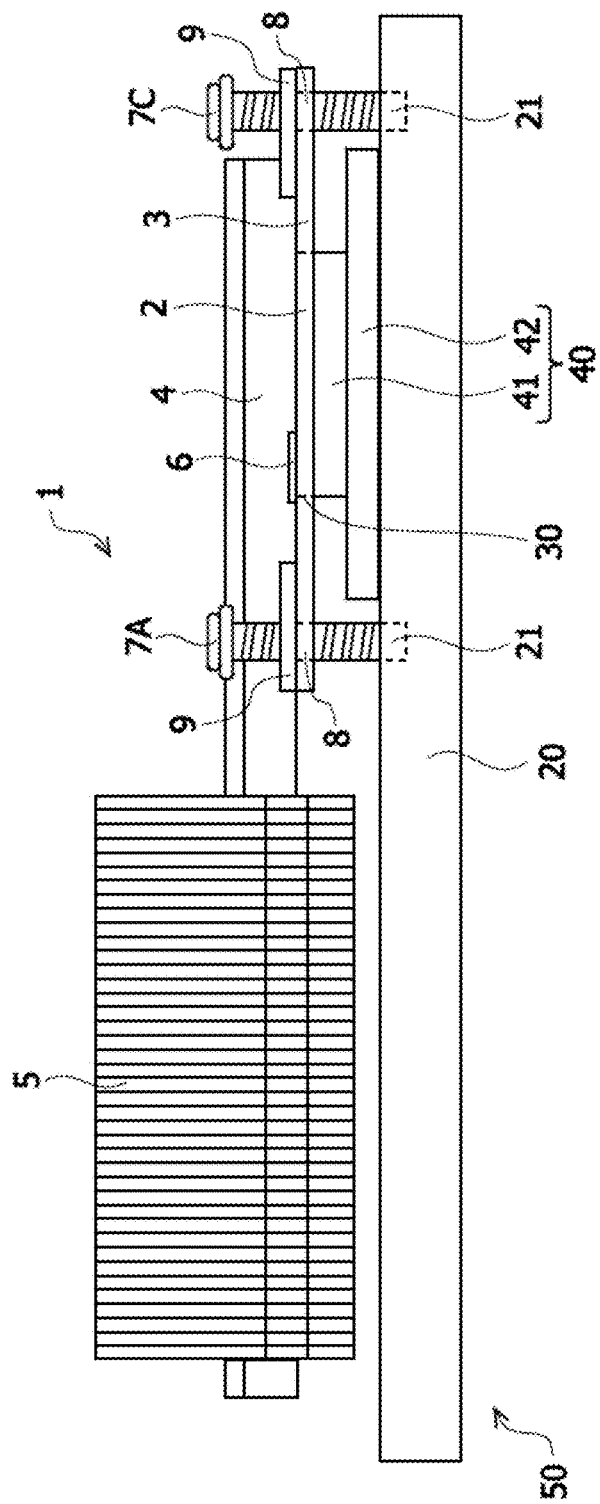

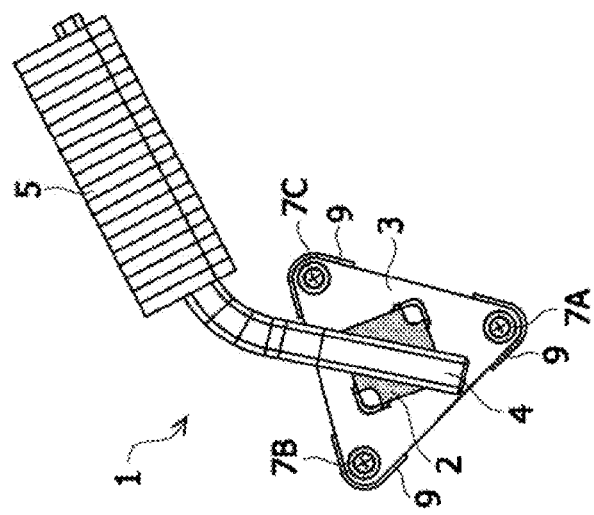

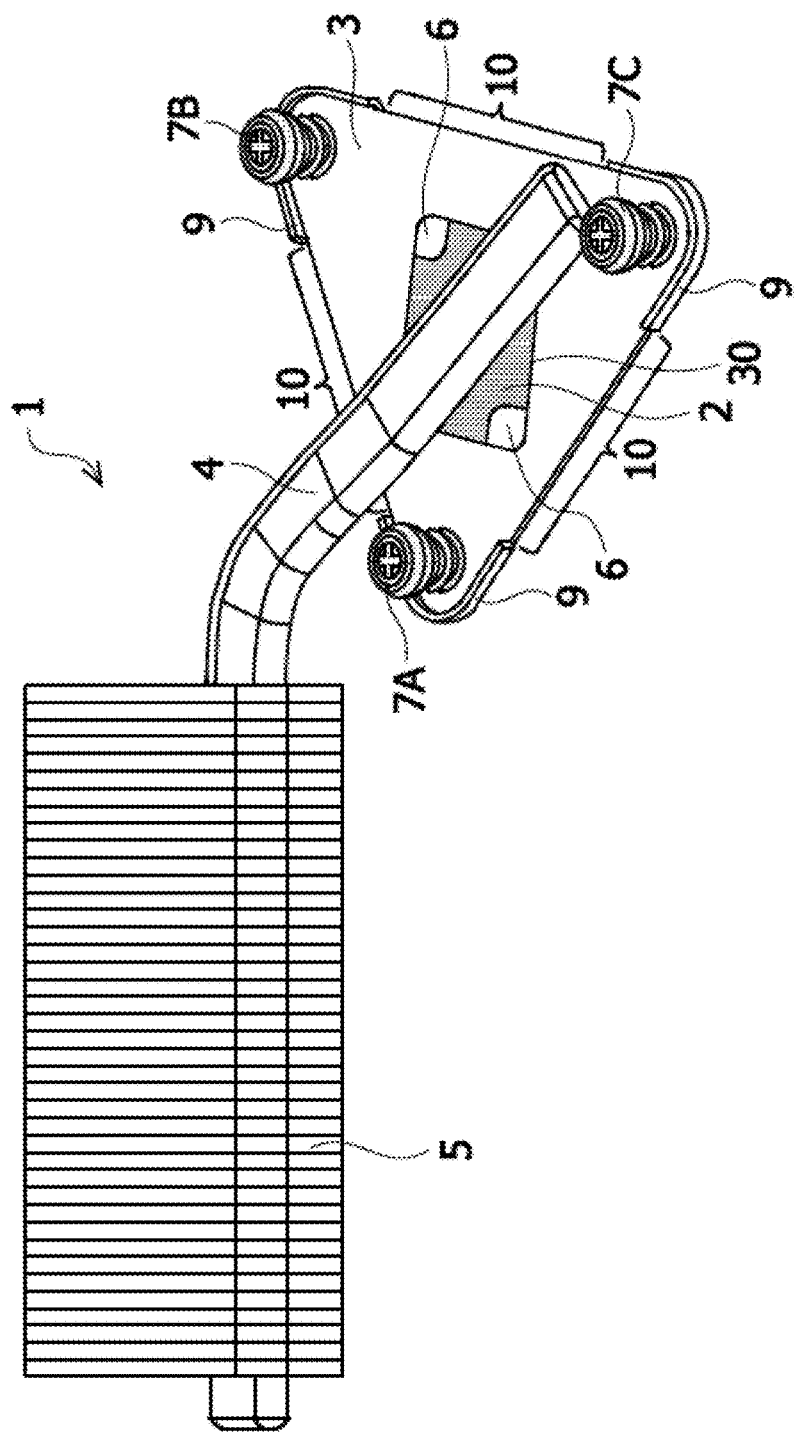

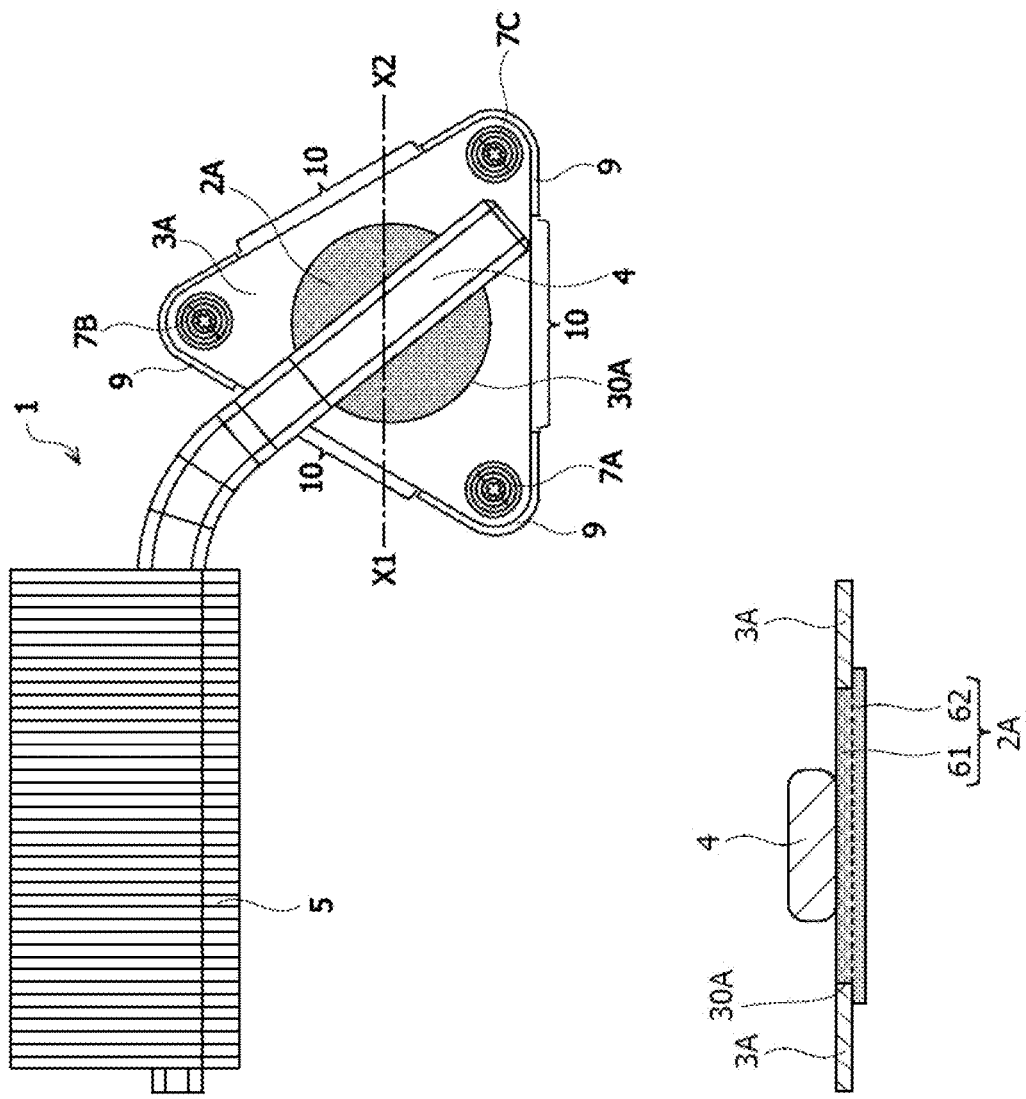

RELATED ART

HEAT DISSIPATION COMPONENT AND TERMINAL DEVICE INCLUDING HEAT DISSIPATION COMPONENT

CROSS-REFERENCE TO RELATED APPLICATION

This application is based upon and claims the benefit of priority of the prior Japanese Patent Application No. 2016-191208, filed on Sep. 29, 2016, the entire contents of which are incorporated herein by reference.

FIELD

The embodiments discussed herein are related to a heat dissipation component and a terminal device including the heat dissipation component.

BACKGROUND

As illustrated in FIG. 8, in a heat dissipation component 100 such as a heat sink, in order to lower the temperature of a heat generating portion such as a processor, a heat receiving unit 101 is brought into contact with the heat generating portion, and a heat pipe 102 is pressed against the heat receiving unit 101, so that the heat of the heat generating portion is transferred to the heat pipe 102 via the heat receiving unit 101. The heat pipe 102 extends to a cooling unit 103, and the heat of the heat generating portion is transferred to the cooling unit 103 via the heat pipe 102 so that the heat generating portion is cooled. The heat receiving unit 101 is supported by a plate 104, and is fixed by fixing portions 105 of the plate 104.

As illustrated in FIG. 9, the peripheral edges of the plate 104 supporting the heat receiving unit 101 are bent to give strength to the plate 104. The heat pipe 102 is disposed on the top surface side of the plate 104. When the peripheral edges of the plate 104 are bent to the top surface side of the plate 104, the heat pipe 102 is incapable of passing through the peripheral edges of the plate 104. Thus, it is requested that a portion of the peripheral edges of the plate 104 through which the heat pipe 102 passes be in a non-bent state. Meanwhile, it is considered that the peripheral edges of the plate 104 are bent to the bottom surface side of the plate 104. However, as illustrated in FIG. 10, the peripheral edges of the plate 104 on the bottom surface side of the plate 104 may not be bent depending on the limitation of a gap between the plate 104 and a main board 110. A heat generating portion 121 and a substrate 122 are disposed on the bottom surface side of the plate 104.

As illustrated in FIG. 9, for example, the positions of three screws 106 on the plate 104 that presses the heat receiving unit 101 against the heat generating portion 121 correspond to the vertexes of an isosceles triangle. By inserting the three screws 106 in screw holes provided in the main board 110, the respective positions of the cooling unit 103 and the plate 104 are fixed to the main board 110. In order to change the position of the cooling unit 103, it is required to newly develop a plate 104 because the positions of the screws 106 do not match the positions of the screw holes of the main board 110 even if the plate 104 is rotated in the plane direction. Also, when it is desired to change the position of the cooling unit 103 without rotating the plate 104 in the plane direction, the heat pipe 102 may not pass through the peripheral edges of the plate 104 when the arrangement of the heat pipe 102 is changed according to the change of the position of the cooling unit 103 because there is only one non-bent portion in the peripheral edges of the plate 104. Accordingly, a plate 104 made for a certain device may not be used for another device having a different peripheral edge through which the heat pipe 102 passes from the certain device.

The following is a reference document.
[Document 1] Japanese Laid-Open Patent Publication No. 2006-147618.

SUMMARY

According to an aspect of the invention, a heat dissipation component includes a plate that presses a heat receiving portion against a heat generating portion, and a heat pipe installed at a first surface side of the plate to be in contact with the heat receiving portion, wherein the plate has a shape of an equilateral triangle in plan view from a normal direction of the first surface of the plate, an outer circumferential portion of the plate, except for a portion between each two vertexes of the equilateral triangle, is bent to the first surface side of the plate, and the heat pipe extends to an outside of the plate through a non-bent portion in the outer circumferential portion of the plate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1C is a side view of the heat dissipation component;
FIGS. 2A to 2C are plan views of the heat dissipation component;
FIG. 4 is a perspective view of the heat dissipation component;
FIG. 6A is a plan view of the heat dissipation component;
FIG. 6B is a sectional view taken along one-dot chain line X1-X2 of FIG. 6A.

DESCRIPTION OF EMBODIMENTS

Hereinafter, embodiments will be described in detail with reference to drawings. The configurations of the following embodiments are exemplary only and the present disclosure is not limited to the configurations of the embodiments.

First Embodiment

Figure 1A:
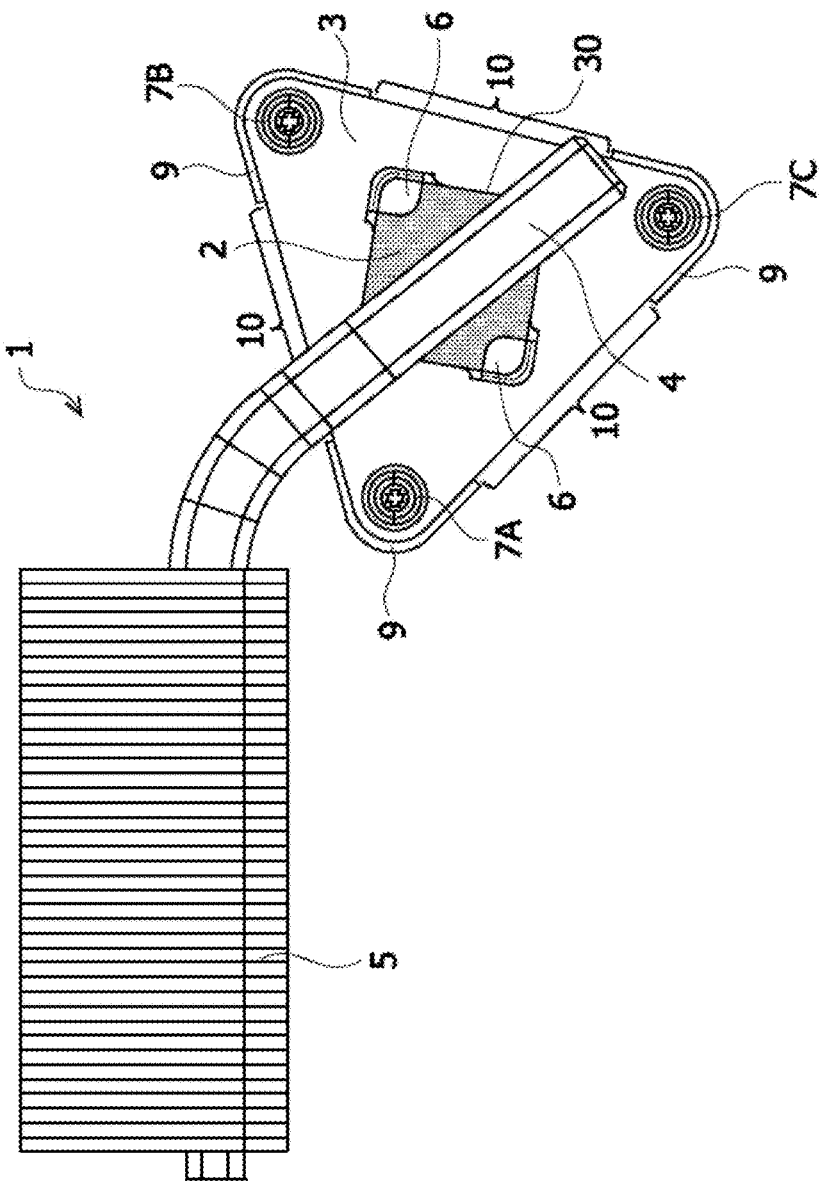
FIG. 1A is a plan view of a heat dissipation component.
Figure 1B:
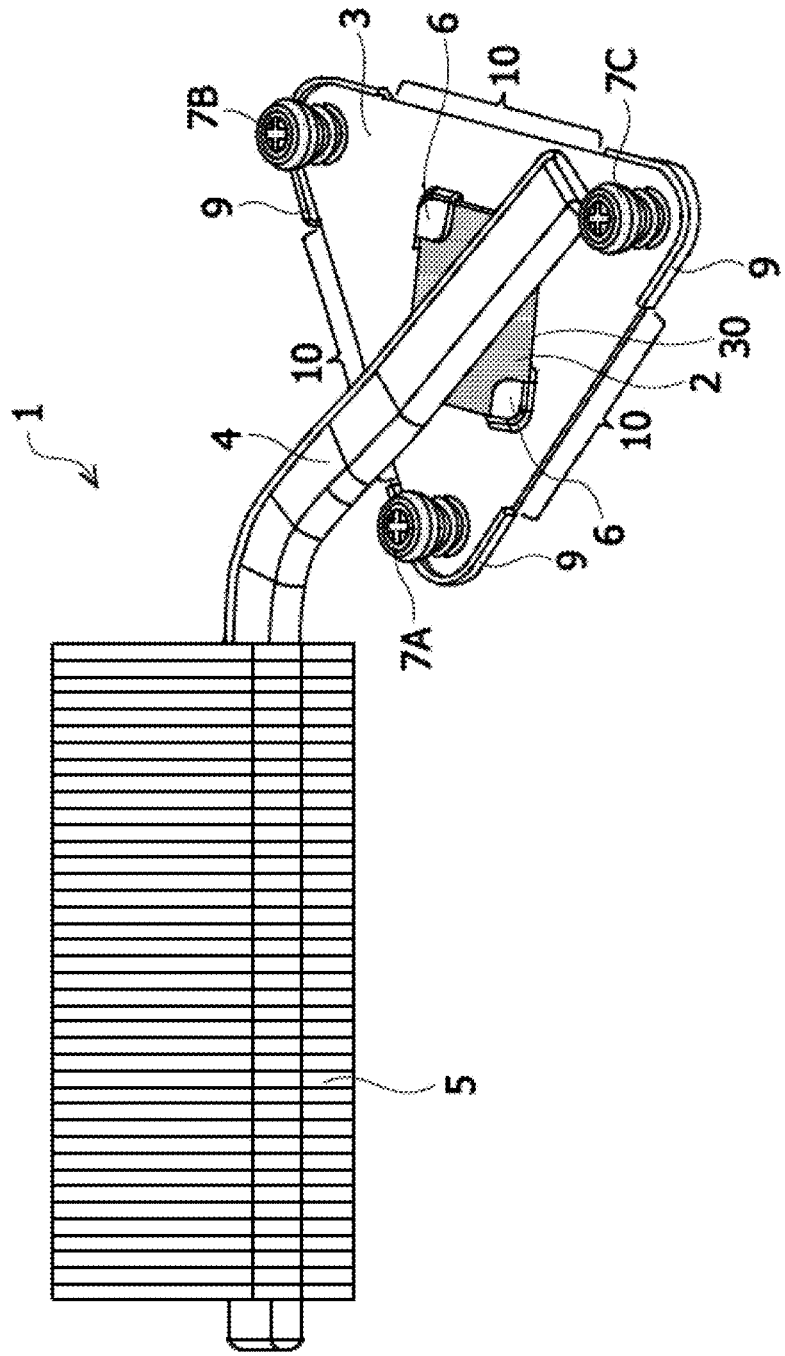
FIG. 1B is a perspective view of the heat dissipation component.
Figure 3C:
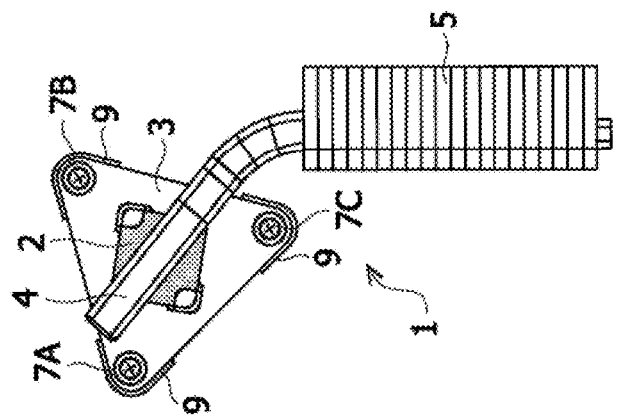
FIGS. 3A to 3C are plan views of the heat dissipation component.
Figure 3B:
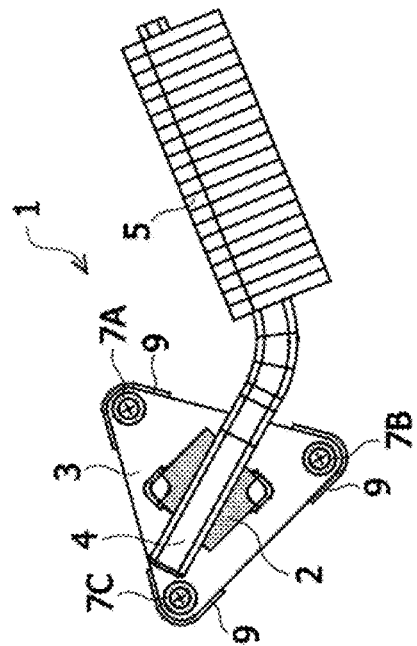
Figure 3A:
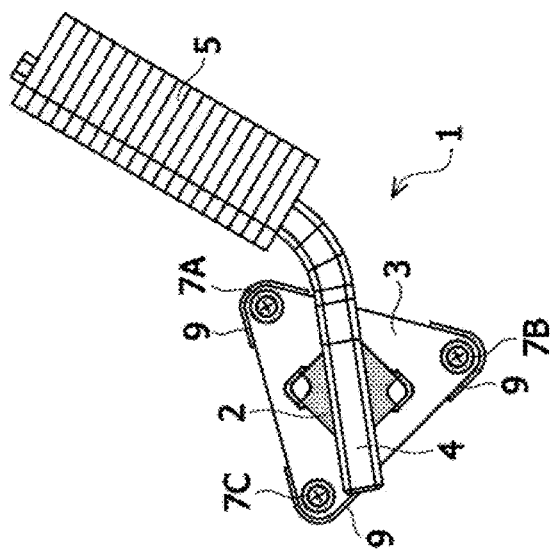

A first embodiment will be described. FIG. 1A is a plan view of a heat dissipation component (heat sink) 1. FIG. 1B is a perspective view of the heat dissipation component 1. The heat dissipation component 1 includes a heat receiving unit (a die plate) 2 that is in contact with a heat generating portion such as a central processing unit (CPU) and absorbs heat from the heat generating portion, a base plate 3 that supports the heat receiving unit 2, a heat pipe 4 that is in contact with the heat receiving unit 2, and a cooling unit 5 connected to the heat pipe 4. The base plate 3 is an example of a "plate." The CPU is also called a processor. The cooling unit 5 may be a heat dissipation fin or a heat dissipation fin including a blower such as a fan.

The heat receiving unit 2 has a substantially quadrangular shape (including a quadrangle) in plan view from the normal direction of the top surface of the base plate 3. The top surface of the base plate 3 is an example of a "first surface of the plate." The material of the heat receiving unit 2 is, for example, copper (Cu) or aluminum (Al). The base plate 3 has a substantially equilateral triangle shape (including an equilateral triangle) in plan view from the normal direction of the top surface of the base plate 3. The material of the base plate 3 is, for example, iron (Fe). The base plate 3 has a through hole 30 formed through the base plate 3. The through hole 30 is formed at the central portion of the base plate 3, and the heat receiving unit 2 is disposed within the through hole 30 of the base plate 3. The top surface of the heat receiving unit 2 is a flat surface, and two corner portions of the heat receiving unit 2, which face each other, are covered by fixing portions 6 formed on the top surface of the base plate 3. The heat receiving unit 2 and the through hole 30 of the base plate 3 have a substantially quadrangular shape (including a quadrangle) in plan view from the normal direction of the top surface of the base plate 3.

Screw holes 8 are provided at three corners of the base plate 3, through which screws 7A to 7C are inserted to fix the base plate 3 to a main board 20. As described above, since the base plate 3 is fixed at three points, the base plate 3 requires less working processes than a base plate that is fixed at four or more points. Screw holes 21 are provided in the main board 20, to which the screws 7A to 7C are fastened. The screws 7A to 7C are arranged at three corners of the base plate 3, respectively, so that the screws 7A to 7C have a positional relationship of a substantially equilateral triangle shape (including an equilateral triangle). FIG. 1C is a side view of a terminal device (electronic component) 50 including the heat dissipation component 1, the main board 20, and a CPU package 40.

As illustrated in FIG. 1C, the CPU package 40 is disposed at the bottom surface side of the base plate 3. The CPU package 40 includes a CPU die 41 and a package substrate 42 provided with the CPU die 41. The CPU die 41 is an example of a "heat generating portion." The base plate 3 presses the heat receiving unit 2 against the CPU die 41 of the CPU package 40. The heat pipe 4 is in contact with the top surface of the heat receiving unit 2, and the CPU die 41 is in contact with the bottom surface of the heat receiving unit 2. The top surface of the heat receiving unit 2 is an example of a "first surface of a heat receiving unit." When the screws 7A to 7C are fastened to the screw holes 21 of the main board 20, the base plate 3 is attracted to the main board 20 side. When the base plate 3 is attracted to the main board 20 side, the fixing portions 6 of the base plate 3 press the heat receiving unit 2 against the CPU die 41. When the heat receiving unit 2 is pressed against the CPU die 41, the thermal connection between the heat receiving unit 2 and the CPU die 41 is stabilized.

The height of the top surface of the heat receiving unit 2 may be equal to the height of the top surface of the base plate 3, or may be higher than the height of the top surface of the base plate 3. The top surface of the heat receiving unit 2 and the top surface of the base plate 3 are directed in the same direction. The height of the top surface of the heat receiving unit 2 corresponds to a distance from the main board 20 to the top surface of the heat receiving unit 2. The height of the top surface of the base plate 3 corresponds to a distance from the main board 20 to the top surface of the base plate 3. When the height of the top surface of the heat receiving unit 2 is equal to the height of the top surface of the base plate 3, no step is present in the boundary between the top surface of the heat receiving unit 2 and the top surface of the base plate 3. Thus, the heat pipe 4 may be disposed in a stable state on the heat receiving unit 2 and the base plate 3. The fact that the height of the top surface of the heat receiving unit 2 is equal to the height of the top surface of the base plate 3 means that the height of the top surface of the heat receiving unit 2 is substantially equal to or approximate to the height of the top surface of the base plate 3.

The outer circumferential portion of the base plate 3 is bent to the top surface side of the base plate 3, except for the portions between each two vertexes of a substantially equilateral triangle. A portion between each two vertexes of the substantially equilateral triangle in the outer circumferential portion of the base plate 3 corresponds to, for example, a central portion (a middle portion) of each peripheral edge of the substantially equilateral triangle in the base plate 3. Accordingly, bent portions 9 are formed at respective vertexes of the substantially equilateral triangle and the portions around the vertexes in the outer circumferential portion of the base plate 3, and cutout portions 10 are formed between the respective bent portions 9. That is, non-bent portions are present between the respective bent portions 9. By partially bending the outer circumferential of the base plate 3, the strength of the base plate 3 is improved. Since the screws 7A to 7C are arranged at the three corners of the base plate 3, respectively, the outer periphery of the base plate 3 around the screws 7A to 7C may be bent.

The heat pipe 4 transfers the heat of the heat receiving unit 2 to the cooling unit 5. The heat pipe 4 is provided at the top surface side of the base plate 3, and the tip portion of the heat pipe 4 is in contact with the heat receiving unit 2. The tip portion of the heat pipe 4 is solder-bonded to the heat receiving unit 2. When the tip portion of the heat pipe 4 is solder-bonded to the heat receiving unit 2, the state where the heat pipe 4 is in contact with the heat receiving unit 2 is maintained, and the thermal connection between the heat receiving unit 2 and the heat pipe 4 is stabilized. The tip portion of the heat pipe 4 may not be solder-bonded, but may be screwed to the heat receiving unit 2. The rear end portion of the heat pipe 4 is connected to the cooling unit 5. The heat pipe 4 extends to the outside of the base plate 3 through a non-bent portion (the cutout portion 10) in the outer circumferential portion of the base plate 3. Accordingly, the heat pipe 4 extends to the outside of the base plate 3 without coming in contact with the bent portions 9 in the outer circumferential portion of the base plate 3.

Figure 8:
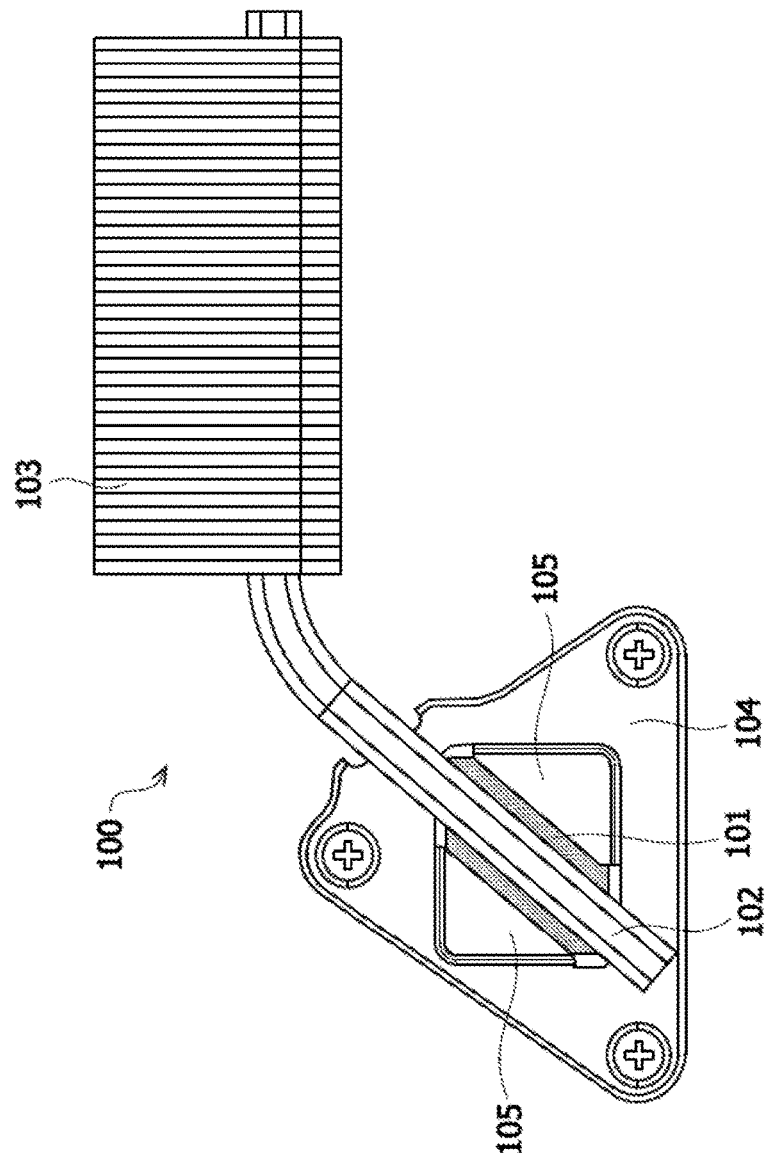
FIG. 8 is a plan view of a heat dissipation component according to a related art.
Figure 9:
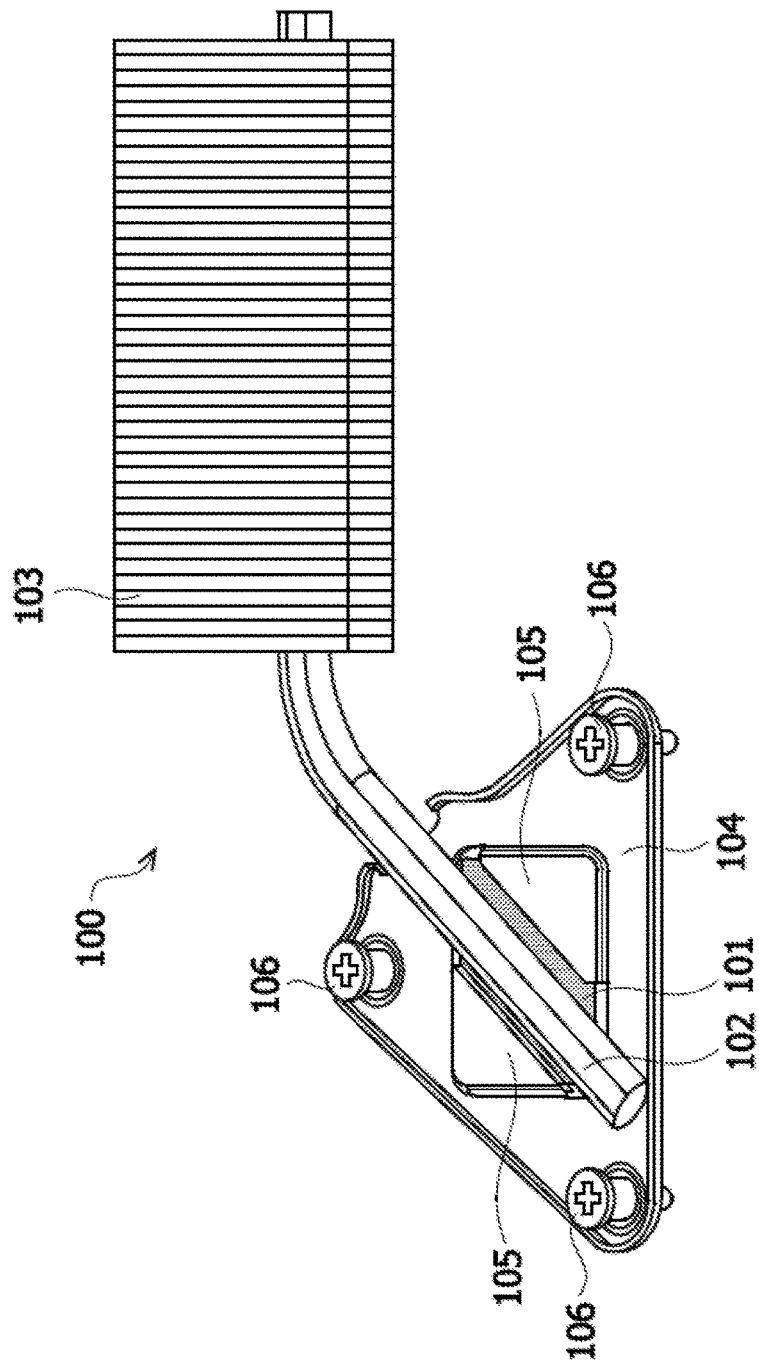
FIG. 9 is a perspective view of the heat dissipation component according to a related art.

The cutout portion 10 is formed in each peripheral edge of the base plate 3, and thus, the heat pipe 4 may extend to the outside of the base plate 3 through any one of the peripheral edges of the base plate 3. Therefore, it is possible to dispose the heat pipe 4 at the top surface side of the base plate 3 by selecting a direction in which the heat pipe 4 is drawn out from multiple directions. The drawing-out direction of the heat pipe 4 may be selected from multiple directions, and then the heat pipe 4 may be solder-bonded to the heat receiving unit 2. Therefore, the degree of freedom of the drawing-out direction of the heat pipe 4 before the heat pipe 4 is solder-bonded to the heat receiving unit 2 is improved. Since the fixing portion 6 of the base plate 3 is smaller than the fixing portion 105 of the plate 104 as illustrated in FIGS. 8 and 9, the exposed area of the heat receiving unit 2 is increased. Accordingly, the area of the heat receiving unit 2 that may come in contact with the heat pipe 4 is increased, and the degree of freedom of the drawing-out direction of the heat pipe 4 is improved.

Figure 10:
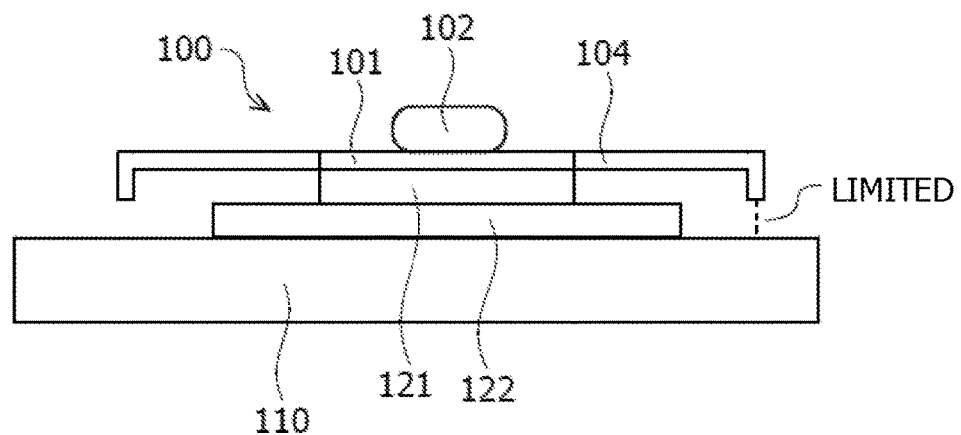
FIG. 10 is a side view of the heat dissipation component according to a related art.

The shape of the heat receiving unit 2 may coincide with the shape of the CPU die 41. When the shape of the heat receiving unit 2 coincides with the shape of the CPU die 41, the size of the heat receiving unit 2 may be made smaller than the size of the heat receiving unit 101 as illustrated in FIGS. 8 to 10. When the size of the heat receiving unit 2 is decreased, it is possible to reduce the size of the through hole 30 of the base plate 3. Accordingly, as the surface area of the base plate 3 is increased, the strength of the base plate 3 is improved.

The base plate 3 has a shape of a substantially equilateral triangle, and positions of the three screws 7A to 7C substantially correspond to vertexes of the equilateral triangle. Accordingly, when the base plate 3 is rotated in the plane direction of the base plate 3 by 120° or 240° with the center of the base plate 3 as the rotation axis, the locations of the screw holes 8 of the base plate 3 become the same as those of the screw holes 21 of the main board 20. Therefore, when the base plate 3 is rotated in the plane direction of the base plate 3 by 120° or 240° with the center of the base plate 3 as the rotation axis, the screws 7A to 7C may be fastened to the screw holes 21 of the main board 20.

The fixing portions 6 protrude to the top surface side of the base plate 3. Therefore, when the drawing-out direction of the heat pipe 4 is changed while the base plate 3 is not rotated, the heat pipe 4 may come into contact with the fixing portions 6. Accordingly, when the base plate 3 is rotated in the plane direction of the base plate 3 by 120° or 240° according to the drawing-out direction of the heat pipe 4, it is possible to avoid a contact between the heat pipe 4 and the fixing portions 6. Accordingly, regardless of a position where the cooling unit 5 is located on the circumference centering on the heat receiving unit 2, the drawing-out direction of the heat pipe 4 may be selected from multiple directions according to the location of the cooling unit 5. Therefore, it is possible to determine the drawing-out direction of the heat pipe 4 corresponding to each of locations of the heat receiving unit 2 and the cooling unit 5 without newly developing the base plate 3, and to achieve the efficiency of the development of the heat dissipation component 1.

FIGS. 2A to 2C and FIGS. 3A to 3C are plan views of the heat dissipation component 1. FIGS. 2A to 2C and FIGS. 3A to 3C illustrate arrangement examples of the base plate 3 according to drawing-out directions of the heat pipe 4 when the drawing-out directions of the heat pipe 4 are selected from multiple directions. Compared to in FIG. 2A, in FIG. 2B, only a drawing-out direction of the heat pipe 4 is changed. Compared to in FIG. 2A, in FIG. 2C, a drawing-out direction of the heat pipe 4 is changed, and the base plate 3 is rotated clockwise in the plane direction of the base plate 3 by 240° with the center of the base plate 3 as the rotation axis. Compared to in FIG. 2A, in FIGS. 3A and 3B, a drawing-out direction of the heat pipe 4 is changed, and the base plate 3 is rotated clockwise in the plane direction of the base plate 3 by 120° with the center of the base plate 3 as the rotation axis. Compared to in FIG. 2A, in FIG. 3C, only a drawing-out direction of the heat pipe 4 is changed.

FIG. 4 is a perspective view of the heat dissipation component 1. As illustrated in FIG. 4, the height of the top surface of the heat receiving unit 2 may be equal to the height of the top surface of the fixing portion 6. The top surface of the fixing portion 6 is an example of "first surface of a fixing portion." The top surface of the heat receiving unit 2, the top surface of the base plate 3, and the top surface of the fixing portion 6 are directed in the same direction. The height of the top surface of the fixing portion 6 corresponds to a distance from the main board 20 to the top surface of the fixing portion 6.

Figure 5A:
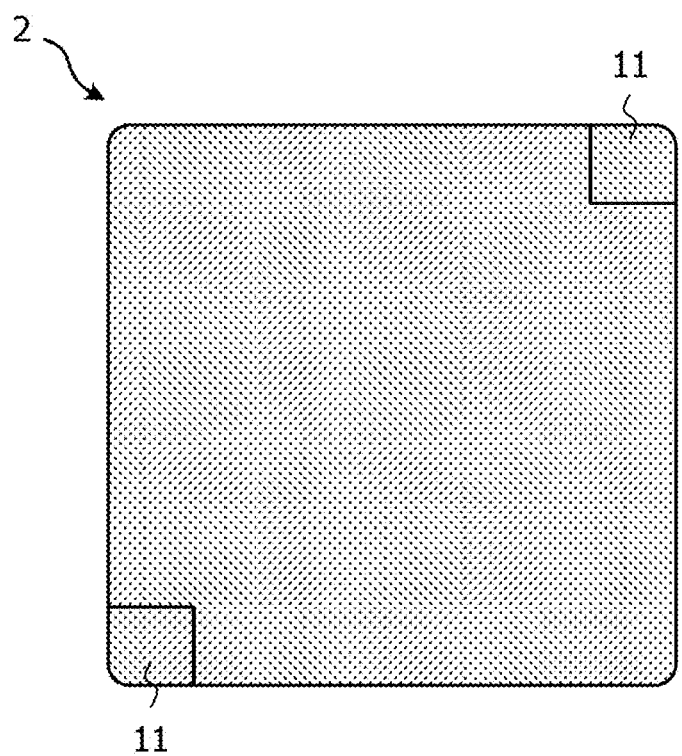
FIG. 5A is a plan view of a heat receiving unit.
Figure 5B:
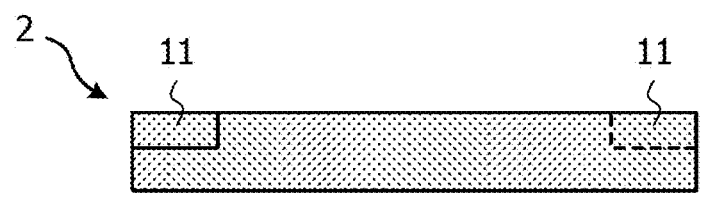
FIG. 5B is a side view of the heat receiving unit.

FIG. 5A is a plan view of the heat receiving unit 2, and FIG. 5B is a side view of the heat receiving unit 2. Recesses 11 are formed at the two corner portions of the heat receiving unit 2, which face each other. The bottom surface of the recess 11 of the heat receiving unit 2 is located at a position lower than the top surface of the heat receiving unit 2, and a distance from the bottom surface of the recess 11 of the heat receiving unit 2 to the top surface of the heat receiving unit 2 is equal to a thickness of the fixing portion 6. When the fixing portion 6 is disposed on the bottom surface of the recess 11 of the heat receiving unit 2, the height of the top surface of the heat receiving unit 2 is equal to the height of the top surface of the fixing portion 6. Since the fixing portion 6 is disposed on the bottom surface of the recess 11 of the heat receiving unit 2, the bottom surface of the fixing portion 6 comes into contact with the bottom surface of the recess 11 of the heat receiving unit 2. The bottom surface of the fixing portion 6 is an example of a "second surface opposite to the first surface of the fixing portion." The fact that the height of the top surface of the heat receiving unit 2 is equal to the height of the top surface of the fixing portion 6 means that the height of the top surface of the heat receiving unit 2 is substantially equal to or approximate to the height of the top surface of the fixing portion 6.

Since the height of the top surface of the heat receiving unit 2 is equal to the height of the top surface of the fixing portion 6, the heat pipe 4 may extend to the outside of the base plate 3 without colliding with the fixing portion 6. That is, the heat pipe 4 may be disposed such that a portion of the heat pipe 4 may overlap at least a portion of the fixing portion 6 in plan view from the normal direction of the top surface of the base plate 3. Accordingly, the degree of freedom of the drawing-out direction of the heat pipe 4 is further improved. Since the height of the top surface of the heat receiving unit 2 is equal to the height of the top surface of the base plate 3, no step is present in the boundary between the heat receiving unit 2 and the base plate 3. Therefore, the heat pipe 4 may be disposed in a stable state on the heat receiving unit 2 and the base plate 3.

The height of the top surface of the heat receiving unit 2, the height of the top surface of the base plate 3, and the height of the top surface of the fixing portion 6 may be equal to each other, or the height of the top surface of the heat receiving unit 2 and the height of the top surface of the fixing portion 6 may be higher than the height of the top surface of the base plate 3. The top surface of the heat receiving unit 2, the top surface of the base plate 3, and the top surface of the fixing portion 6 are directed in the same direction. When the height of the top surface of the heat receiving unit 2 is equal to the height of the top surface of the base plate 3, no step is present in the boundary between the top surface of the heat receiving unit 2 and the top surface of the base plate 3. When the height of the top surface of the base plate 3 is equal to the height of the top surface of the fixing portion 6, no step is present in the boundary between the top surface of the base plate 3 and the top surface of the fixing portion 6.

Therefore, the heat pipe 4 may be disposed in a stable state on the heat receiving unit 2, the base plate 3 and the fixing portions 6. The fact that the height of the top surface of the base plate 3 is equal to the height of the top surface of the fixing portion 6 means that the height of the top surface of the base plate 3 is substantially equal to or approximate to the height of the top surface of the fixing portion 6.

The heat receiving unit 2 and the base plate 3 may be integrally formed of the same material. For example, by using copper or aluminum as a material for the heat receiving unit 2 and the base plate 3, the heat receiving unit 2 and the base plate 3 may be integrally formed. When the heat receiving unit 2 and the base plate 3 are integrally formed of the same material, a step of disposing the heat receiving unit 2 within the through hole 30 of the base plate 3 is omitted.

Second Embodiment

The second embodiment will be described. FIG. 6A is a plan view of the heat dissipation component 1. FIG. 6B is a sectional view taken along one-dot chain line X1-X2 in FIG. 6A. The heat dissipation component 1 includes a heat receiving unit 2A, a base plate 3A, a heat pipe 4, and a cooling unit 5. The base plate 3A has a substantially equilateral triangle shape (including an equilateral triangle) in plan view from the normal direction of the top surface of the base plate 3A. The top surface of the base plate 3A is an example of a "first surface of a plate." The base plate 3A has a through hole 30A formed through the base plate 3A. The through hole 30A is formed in the central portion of the base plate 3A. The heat receiving unit 2A and the through hole 30A of the base plate 3A are circular in plan view from the normal direction of the top surface of the base plate 3A. The heat pipe 4 is in contact with the top surface of the heat receiving unit 2A, and the CPU die 41 of the CPU package 40 is in contact with the bottom surface of the heat receiving unit 2A. The top surface of the heat receiving unit 2A is an example of a "first surface of a heat receiving unit."

Figure 7:
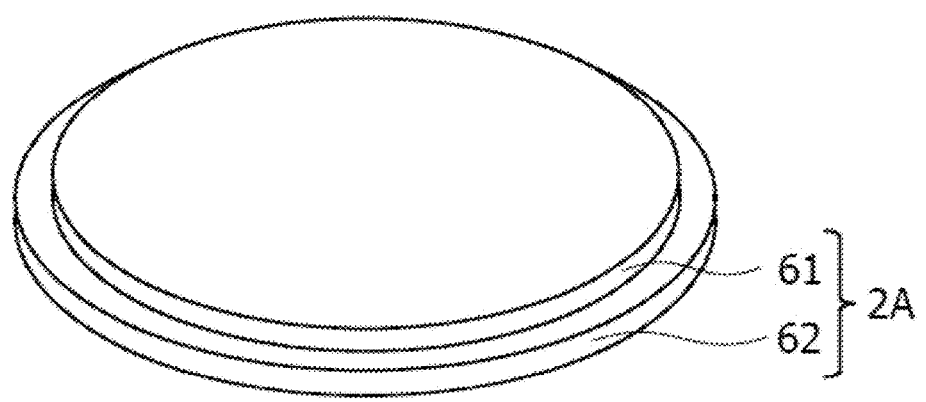
FIG. 7 is a perspective view of a heat receiving unit.

FIG. 7 is a perspective view of the heat receiving unit 2A. The heat receiving unit 2A has a flange shape, and includes a first cylindrical portion 61, and a second cylindrical portion 62 having a diameter larger than that of the first cylindrical portion 61. The first cylindrical portion 61 and the second cylindrical portion 62 are formed in a cylindrical shape, and are rotatable in the plane direction of the base plate 3A. Accordingly, the heat receiving unit 2A is rotatable in the plane direction of the base plate 3A. The first cylindrical portion 61 is disposed within the through hole 30A of the base plate 3A. The heat pipe 4 is in contact with the first cylindrical portion 61, and the CPU die 41 is in contact with the second cylindrical portion 62. The diameter of the first cylindrical portion 61 is substantially equal to or slightly smaller than the diameter of the through hole 30A of the base plate 3A. The diameter of the second cylindrical portion 62 is larger than the diameter of the through hole 30A of the base plate 3A.

The thickness of the first cylindrical portion 61 is equal to the thickness of the base plate 3A. Since the diameter of the second cylindrical portion 62 is larger than the diameter of the through hole 30A of the base plate 3A, the outer circumferential portion of the second cylindrical portion 62 is in contact with the bottom surface of the base plate 3A. The bottom surface of the base plate 3A is an example of a "second surface opposite to the first surface of a plate." When the screws 7A to 7C are fastened to the screw holes 21 of the main board 20, the base plate 3A is attracted to the main board 20 side. When the base plate 3A is attracted to the main board 20 side, a portion of the base plate 3A in contact with the second cylindrical portion 62 presses the heat receiving unit 2A against the CPU die 41. When the heat receiving unit 2A is pressed against the CPU die 41, the thermal connection between the heat receiving unit 2A and the CPU die 41 is stabilized.

The thickness of the base plate 3A is equal to the thickness of the first cylindrical portion 61, and the outer circumferential portion of the second cylindrical portion 62 is in contact with the bottom surface of the base plate 3A. Therefore, the height of the top surface of the heat receiving unit 2A is equal to the height of the top surface of the base plate 3A, and no step is present in the boundary between the top surface of the heat receiving unit 2A and the top surface of the base plate 3A. Thus, the heat pipe 4 may be disposed in a stable state on the heat receiving unit 2A and the base plate 3A. The height of the top surface of the heat receiving unit 2A corresponds to a distance from the main board 20 to the top surface of the heat receiving unit 2A. The height of the top surface of the base plate 3A corresponds to a distance from the main board 20 to the top surface of the base plate 3A. The fact that the height of the top surface of the heat receiving unit 2A is equal to the height of the top surface of the base plate 3A means that the height of the top surface of the heat receiving unit 2A is substantially equal to or approximate to the height of the top surface of the base plate 3A.

Since the base plate 3A has no fixing portion 6, the drawing-out direction of the heat pipe 4 is not limited by the fixing portion 6. Accordingly, according to the heat dissipation component 1 according to the second embodiment, the degree of freedom of the drawing-out direction of the heat pipe 4 is further improved. The heat receiving unit 2A is rotatable in the plane direction of the base plate 3A. Therefore, even after the heat pipe 4 is solder-bonded to the heat receiving unit 2A, the drawing-out direction of the heat pipe 4 may be changed by rotating the heat receiving unit 2A in the plane direction of the base plate 3A. Accordingly, according to the heat dissipation component 1 according to the second embodiment, the degree of freedom of the drawing-out direction of the heat pipe 4 is further improved.

The heat receiving unit 2A and the base plate 3A may be integrally formed of the same material. For example, by using copper or aluminum as a material for the heat receiving unit 2A and the base plate 3A, the heat receiving unit 2A and the base plate 3A may be integrally formed. When the heat receiving unit 2A and the base plate 3A are integrally formed of the same material, a step of disposing the heat receiving unit 2A within the through hole 30A of the base plate 3A is omitted.

According to the first and second embodiments, the base plate 3 (3A) is also capable of being applied to the heat dissipation component 1 in which the heat pipe 4 may extend to the outside of the base plate 3 (3A) from any of the peripheral edges of the base plate 3 (3A). According to the first and second embodiments, by selecting the drawing-out direction of the heat pipe 4 from multi directions, use members of the heat dissipation component 1 may be used in common, and reduction of a mold cost and a cost reduction for a unit price of the heat dissipation component 1 may be achieved. A heat sink vendor only has to change the drawing-out direction of the heat pipe 4 in the solder-bonding between the heat receiving unit 2 (2A) and the heat pipe 4. Therefore, even from the view point of the heat sink vendor, the quality improvement is achieved, leading to a cost reduction.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A heat dissipation component comprising:
   a plate that presses a heat receiving portion against a heat generating portion; and
   a heat pipe installed at a first surface side of the plate to be in contact with the heat receiving portion,
   wherein the plate has a shape of an equilateral triangle in plan view from a normal direction of the first surface of the plate,
   an outer circumferential portion of the plate, except for a portion between each two vertexes of the equilateral triangle, is bent to the first surface side of the plate, and
   the heat pipe extends to an outside of the plate through a non-bent portion in the outer circumferential portion of the plate.

2. The heat dissipation component according to claim 1, wherein the heat pipe is in contact with a first surface of the heat receiving portion,
   the heat receiving portion has a recess formed on the first surface of the heat receiving portion,
   the plate has a through hole formed therethrough and a fixing portion that presses the heat receiving portion against the heat generating portion,
   the heat receiving portion is disposed within the through hole,
   a height of the first surface of the heat receiving portion and a height of a first surface of the fixing portion are substantially equal to each other, and
   a second surface opposite to the first surface of the fixing portion is in contact with a bottom surface of the recess.

3. The heat dissipation component according to claim 1, wherein the heat pipe is in contact with a first surface of the heat receiving portion,
   the heat receiving portion includes a first cylindrical portion and a second cylindrical portion which are rotatable in a plane direction of the plate,
   the plate has a through hole formed therethrough,
   the first cylindrical portion is disposed within the through hole,
   a diameter of the second cylindrical portion is larger than a diameter of the through hole,
   the second cylindrical portion is in contact with a second surface opposite to the first surface of the plate, and
   a height of the first surface of the plate and a height of the first surface of the heat receiving portion are substantially equal to each other.

4. The heat dissipation component according to claim 1, wherein the heat receiving portion and the plate are integrally formed of a same material.

5. A terminal device comprising:
   a substrate;
   a heat generating component on the substrate; and
   a heat dissipation component installed on the substrate to be in contact with the heat generating component,
   wherein the heat dissipation component includes:
   a plate that presses a heat receiving portion against the heat generating component; and
   a heat pipe installed at a first surface side of the plate to be in contact with the heat receiving portion,
   wherein the plate has a shape of an equilateral triangle in plan view from a normal direction of the first surface of the plate,
   an outer circumferential portion of the plate, except for a portion between each two vertexes of the equilateral triangle, is bent to the first surface side of the plate, and
   the heat pipe extends to an outside of the plate through a non-bent portion in the outer circumferential portion of the plate.

* * * * *